(12) United States Patent
Mita et al.

(10) Patent No.: US 11,594,513 B2
(45) Date of Patent: Feb. 28, 2023

(54) MANUFACTURING METHOD FOR SEMICONDUCTOR DEVICE

(71) Applicant: NITTO DENKO CORPORATION, Ibaraki (JP)

(72) Inventors: Ryota Mita, Ibaraki (JP); Tomoaki Ichikawa, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 18 days.

(21) Appl. No.: 17/050,568

(22) PCT Filed: Mar. 27, 2019

(86) PCT No.: PCT/JP2019/013149
§ 371 (c)(1),
(2) Date: Oct. 26, 2020

(87) PCT Pub. No.: WO2019/208072
PCT Pub. Date: Oct. 31, 2019

(65) Prior Publication Data
US 2021/0242165 A1    Aug. 5, 2021

(30) Foreign Application Priority Data
Apr. 27, 2018   (JP) .............................. JP2018-086474

(51) Int. Cl.
*H01L 23/00*     (2006.01)
*H01L 21/56*     (2006.01)
(Continued)

(52) U.S. Cl.
CPC ............ *H01L 24/83* (2013.01); *H01L 21/565* (2013.01); *H01L 24/29* (2013.01); *H01L 24/73* (2013.01);
(Continued)

(58) Field of Classification Search
CPC ..... H01L 2224/27505; H01L 2224/838; H01L 2224/83801; H01L 2224/8384;
(Continued)

(56) References Cited

U.S. PATENT DOCUMENTS 10,669,454 B2   6/2020 Honda et al.
2018/0247884 A1*  8/2018 Hasegawa ......... H01L 23/49575
(Continued)

FOREIGN PATENT DOCUMENTS

EP     2 960 930 A1   12/2015
JP     2013-039589 A   2/2013
(Continued)

OTHER PUBLICATIONS

International Search Report for PCT/JP2019/013149, dated May 14, 2019.
(Continued)

*Primary Examiner* — Julio J Maldonado
*Assistant Examiner* — Stanetta D Isaac
(74) *Attorney, Agent, or Firm* — Sughrue Mion, PLLC (57) ABSTRACT

A semiconductor device manufacturing method includes a preparation step and a sinter bonding step. In the preparation step, a sinter-bonding work having a multilayer structure including a substrate, semiconductor chips, and sinter-bonding material layers is prepared. The semiconductor chips are disposed on, and will bond to, one side of the substrate. Each sinter-bonding material layer contains sinterable particles and is disposed between each semiconductor chip and the
(Continued)

substrate. In the sinter bonding step, a cushioning sheet having a thickness of 5 to 5000 μm and a tensile elastic modulus of 2 to 150 MPa is placed on the sinter-bonding work, the resulting stack is held between a pair of pressing faces, and, in this state, the sinter-bonding work between the pressing faces undergoes a heating process while being pressurized in its lamination direction, to form a sintered layer from each sinter-bonding material layer.

6 Claims, 6 Drawing Sheets

(51) Int. Cl.
*H01L 25/07* (2006.01)
*H01L 25/00* (2006.01)

(52) U.S. Cl.
CPC ............ *H01L 25/072* (2013.01); *H01L 25/50* (2013.01); *H01L 2224/29239* (2013.01); *H01L 2224/29247* (2013.01); *H01L 2224/29287* (2013.01); *H01L 2224/73265* (2013.01); *H01L 2224/83005* (2013.01); *H01L 2224/8384* (2013.01); *H01L 2924/1033* (2013.01); *H01L 2924/10272* (2013.01)

(58) Field of Classification Search
CPC ... H01L 2224/8385; H01L 2224/83885; H01L 2224/32225; H01L 2224/8392
See application file for complete search history.

(56) References Cited

U.S. PATENT DOCUMENTS

| | | |
|---|---|---|
| 2018/0273808 A1 | 9/2018 | Kamakura et al. |
| 2018/0312731 A1 | 11/2018 | Honda et al. |
| 2020/0058517 A1 | 2/2020 | Matsumoto |
| 2020/0095481 A1 | 3/2020 | Honda et al. |

FOREIGN PATENT DOCUMENTS

| | | |
|---|---|---|
| JP | 2013-131592 A | 7/2013 |
| JP | 2017-112136 A | 6/2017 |
| JP | 2017-121648 A | 7/2017 |
| TW | 201724295 A | 7/2017 |
| TW | 201930528 A | 8/2019 |
| WO | 2008/065728 A1 | 6/2008 |
| WO | 2014/129626 A1 | 8/2014 |
| WO | 2017/057485 A1 | 4/2017 |
| WO | 2017/073630 A1 | 5/2017 |
| WO | 2017/195399 A1 | 11/2017 |

OTHER PUBLICATIONS

Office Action dated Aug. 3, 2022 in Taiwanese Application No. 108112460.
Extended European Search Report dated May 10, 2022 in European Application No. 19791911.1.

* cited by examiner

MANUFACTURING METHOD FOR SEMICONDUCTOR DEVICE

CROSS REFERENCE TO RELATED APPLICATIONS

This application is a National Stage of International Application No. PCT/JP2019/013149 filed Mar. 27, 2019, claiming priority based on Japanese Patent Application No. 2018-086474 filed Apr. 27, 2018.

TECHNICAL FIELD

The present invention relates to methods for manufacturing semiconductor devices such as so-called power semiconductor devices.

BACKGROUND ART

In some semiconductor device productions, a semiconductor chip is die-bonded to a substrate (base) such as a lead frame or an insulated substrate (insulated circuit board) while establishing and keeping electrical connection with the substrate. Known examples of this technique include a technique of forming a Au—Si eutectic alloy layer between the substrate and the chip to actually provide a bonding state; and a technique of using a bonding material such as solder, or a resin containing conductive particles.

Power semiconductor devices, which assume power supply and control, have become remarkably widespread. Many of such power semiconductor devices output large heat due to the passage of large current during operation. The power semiconductor device productions therefore require a technique that can actually provide a highly reliable bonding state even in a high-temperature operation, in die-bonding of a semiconductor chip onto a substrate while allowing the semiconductor chip to establish and keep electrical connection with the substrate. In particular, this is significantly demanded by power semiconductor devices that employ SiC or GaN as a semiconductor material and are to operate at high temperatures. A proposed die bonding technique with electrical connection to meet the requirement employs a material for sinter bonding (sinter-bonding material) containing, for example, sinterable particles and a solvent (vehicle).

In such die bonding using a sinter-bonding material containing sinterable particles, initially, a semiconductor chip is placed on a predetermined chip-mounting area of a substrate, through the sinter-bonding material under predetermined temperature and load conditions. Then, between the substrate and the semiconductor chip over the substrate, a sintering process operates under predetermined temperature and pressurization conditions so that the solvent in the sinter-bonding material undergoes, for example, volatilization and the sintering proceeds between the sinterable particles. This forms a sintered layer between the substrate and the semiconductor chip and allows the semiconductor chip to electrically connect with, and mechanically bond to, the substrate. The technique as above is taught typically by Patent Literature (PTL) 1 and PTL 2 as follows.

CITATION LIST

Patent Literature

PTL 1 PCT International Publication Number WO2008/065728
PTL 2 Japanese Unexamined Patent Application Publication (JP-A) No. 2013-039580

SUMMARY OF INVENTION

Technical Problem

A sinter bonding step in a semiconductor device manufacture process using die bonding through sinter bonding may employ a hot press machine including a pair of parallel hot-press plates. Specifically, in the step, a work, namely, the substrate and the semiconductor chip temporarily secured to each other via a layer of the sinter-bonding material, is held between the pair of parallel plates, which is configured to open in the lamination direction of the substrate and the semiconductor chip, and is heated and pressurized by the pair of parallel plates while being held between the plates. Through the process as above, the sinter-bonding material layer converts into a sintered layer, which allows the semiconductor chip to sinter-bond to the substrate.

A sinter bonding step in a semiconductor device manufacture process using die bonding through sinter bonding may perform sinter bonding of multiple semiconductor chips to a substrate by batch (by one operation). However, sintered layers formed as a result of such a batch sinter bonding step using the hot press machine may include sintered layers whose outer edge does not bond to the substrate or the semiconductor chip. The poor bonding (bonding failure) as above is probably caused by non-uniformity of the load between the sinter-bonding material layers in the sinter bonding step, where the load acts upon the work held between the parallel plates. The semiconductor chips and the sinter-bonding material layers each have a small thickness of several micrometers to several hundreds of micrometers, and the deviation or inclination from an ideal parallel position of the parallel plates often invites a difference in load among the semiconductor chips or among sinter-bonding material layers, in the sinter bonding step using such a hot press machine including a pair of parallel plates. The bonding failure may probably occur when the accuracy (precision) in the parallelism or position control in the parallel plates is not consistent with the thinness of the semiconductor chips or the sinter-bonding material layers.

The present invention has been made under these circumstances and has an object to provide a technique suitable for batch sinter bonding of semiconductor chips to a substrate in a semiconductor device manufacturing method through a semiconductor chip sinter bonding step performed under a pressurized condition.

Solution to Problem

The present invention provides, in an embodiment, a semiconductor device manufacturing method that includes a preparation step and a sinter bonding step as described below. This method is suitable for the manufacture of semiconductor devices, such as power semiconductor devices, which include semiconductor chips in sinter-bonded areas.

In the preparation step, a sinter-bonding work is prepared. The sinter-bonding work includes a substrate, semiconductor chips, and sinter-bonding material layers. The substrate has a first surface, and a second surface opposite to the first surface. The semiconductor chips each face, and are to bond to, the first surface of the substrate. The sinter-bonding material layers are each disposed between the substrate and each semiconductor chip and contain sinterable particles.

For example, the sinter-bonding work can be prepared by compression-bonding and thereby temporarily securing semiconductor chips each with a sinter-bonding material layer to the substrate through the sinter-bonding material layer. A non-limiting example of a material to give the sinter-bonding material layers usable herein is a sheet (sinter-bonding sheet) of a composition including sinterable particles and a thermally decomposable polymer binder.

In the sinter bonding step, each semiconductor chip sinter-bonds to the substrate in the inter-bonding work, while using a cushioning sheet. The cushioning sheet for use herein has a thickness of 5 to 5000 µm and a tensile elastic modulus of 2 to 150 MPa. As used herein, the term "tensile elastic modulus" of a cushioning sheet refers to a value determined on the basis of measurement in a tensile test on a cushioning sheet test piece having a width of 10 mm, a length of 40 mm, and a thickness of 100 µm, at an initial gripping distance of 10 mm, a temperature of 23° C., and a tensile speed of 50 mm/min. In the sinter bonding step, the cushioning sheet as above lies on or over the sinter-bonding work, and the resulting stack is held between a pair of pressing faces of a hot press machine. In this state, the sinter-bonding work in the stack disposed between the pressing faces undergoes a heating process while being pressurized in the lamination direction of the work, to form a sintered layer from each sinter-bonding material layer in the work. The pair of pressing faces is, for example, a pair of opposed faces in a pair of parallel hot-press plates. The cushioning sheet lies over the semiconductor chip-mounting side, or over the second surface of the substrate, in the sinter-bonding work. The formation of the sintered layer between substrate and each semiconductor chip causes each semiconductor chip to sinter-bond to the substrate.

In the sinter bonding step in the semiconductor device manufacturing method according to the embodiment, the sinter-bonding work is heated with pressurization while the sinter-bonding work lies over the cushioning sheet having a thickness of 5 to 5000 µm and a tensile elastic modulus of 2 to 150 MPa and, and the resulting stack is held between pressing faces of the hot press machine, as described above. This configuration is suitable for actually providing high uniformity in pressure or load between sinter-bonding material layers in the sinter bonding step, where the pressure or load acts upon the sinter-bonding work which is held between the parallel plates. This is because, in the sinter bonding step, the cushioning sheet, which has a thickness of 5 to 5000 µm and a tensile elastic modulus of 2 to 150 MPa and is to lie over the sinter-bonding work, exerts such a cushioning function as to effectively absorb, and reduce or eliminate the deviation or inclination from the ideal parallel position in the pair of pressing faces; and the difference, if any, between or among the semiconductor chips in height (dimension) from the first face of the substrate to the top face of the semiconductor chip.

In addition, the cushioning sheet having a thickness of 5 to 5000 µm and a tensile elastic modulus of 2 to 150 MPa has sufficient shape retainability and is easy to handle in the semiconductor device manufacture process. The cushioning sheet as above is easy to lie over the sinter-bonding work efficiently in a suitable arrangement in the sinter bonding step.

As is described above, the semiconductor device manufacturing method according to the present invention is suitable for sinter bonding of semiconductor chips to a substrate by batch (by one operation).

In an embodiment, the cushioning sheet for use in the sinter bonding step has a weight loss percentage at 350° C. of 0.1% or less, as determined in a weight loss measurement performed in an air atmosphere, starting at 25° C. which is the reference temperature for weight, and a rate of temperature rise of 10° C./min. In addition, the cushioning sheet has a weight loss percentage of 0% at the reference temperature for weight (25° C.). This configuration is advantageous for allowing the cushioning sheet to sufficiently exert its functions such as cushioning function in a sinter bonding step including a high-temperature heating process. The weight loss percentage of the cushioning sheet can be measured typically on a cushioning sheet sample of about 10 mg using a simultaneous thermogravimetric/differential thermal analyzer.

The sinter bonding step preferably operates at a temperature in the heating process of 200° C. or higher and a pressure in the pressurization of 5 MPa or more. Specifically, in the sinter bonding step, the sinter-bonding work between the pair of pressing faces undergoes a heating process preferably at a temperature of 200° C. or higher, while receiving pressurization in its lamination direction at a pressure of preferably 5 MPa or more, to form a sintered layer from each sinter-bonding material layer (to convert each sinter-bonding material layer into a sintered layer). This configuration is advantageous for forming a strong sintered layer between the substrate and each semiconductor chip, which sinter-bond to each other.

The sinterable particles in the sinter-bonding material layer preferably include at least one selected from the group consisting of silver particles, copper particles, silver oxide particles, and copper oxide particles. This configuration is advantageous for forming a strong (firm) sintered layer between the substrate and each semiconductor chip, which are sinter-bonded to each other.

The sinter-bonding material layers each contain the sinterable particles in a proportion of preferably 60 to 99 mass percent, more preferably 65 to 98 mass percent, and still more preferably 70 to 97 mass percent, from the viewpoint of actually providing highly reliable sinter bonding.

DESCRIPTION OF EMBODIMENTS

FIGS. 1 to 4(b) illustrate a semiconductor device manufacturing method according to one embodiment of the present invention. The semiconductor device manufacturing method according to the embodiment is a method for manufacturing a semiconductor device, such as a power semiconductor device, that includes semiconductor chips in sinter-bonded areas. The method includes a preparation step and a sinter bonding step as follows.

Figure 1:
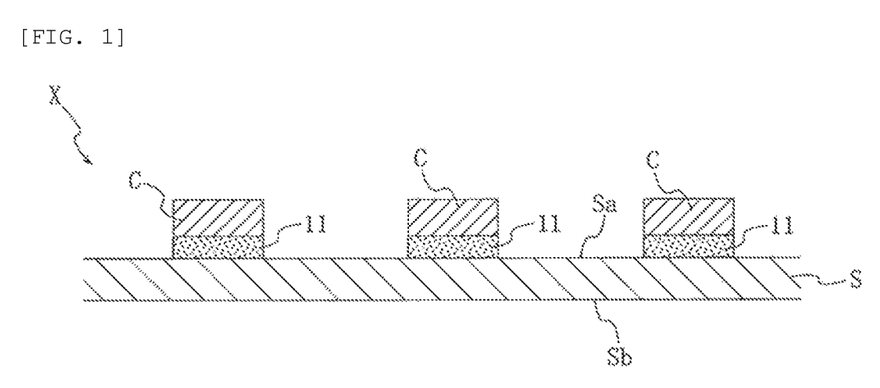
FIG. 1 depicts a part of steps in a semiconductor device manufacturing method according to one embodiment of the present invention.

In the preparation step, a sinter-bonding work X as illustrated in FIG. 1 is prepared. The work X will undergo the sinter bonding step. The sinter-bonding work X has a multilayer structure including a substrate S, chips C, and sinter-bonding material layers 11.

The substrate S has a surface Sa, and an opposite surface Sb. Non-limiting examples of the substrate S include insulated circuit boards bearing wiring such as copper wiring on the surface; and lead frames. The chip-mounting areas in the substrate S may be a surface of the base such as copper wiring or a lead frame, or may be a surface of a plated layer disposed on the base. Non-limiting examples of the plated layer include gold-plated layers, silver-plated layers, nickel-plated layers, palladium-plated layers, and platinum-plated layers.

Each chip C is a semiconductor chip and has an element-bearing side on which a semiconductor element or elements are disposed, and a backside opposite to the element-bearing side. The chip C bears a plane electrode (not shown) as an external electrode on the backside. The chip backside (lower face in FIG. 1) is temporarily secured via the sinter-bonding material layer 11 to the surface Sa of the substrate S. Non-limiting examples of a material to constitute the chip body in the chip C include silicon carbide (SiC), gallium nitride (GaN), and other semiconductor materials for power semiconductor devices. The chip C has a thickness of typically 20 to 1000 μm.

Each sinter-bonding material layer 11 is, in the embodiment, a layer of a composition including conductive metal-containing sinterable particles and a binder component and lies, for each chip C, between the chip C and the substrate S.

The sinter-bonding work X having the multilayer structure as above can be prepared by the following procedure.

Figures 2A, 2B:
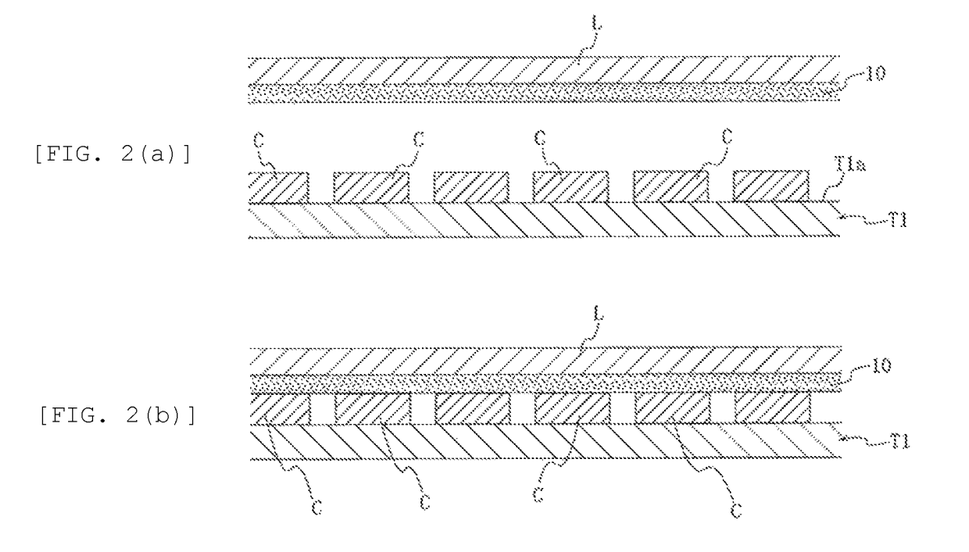
FIGS. 2(a)-2(d) depicts an embodiment of a way to prepare a sinter-bonding work.

Initially, chips C and a sinter-bonding sheet 10 are prepared as illustrated in FIG. 2(a). Each of the chips C bears an already-formed predetermined semiconductor element or elements and is secured onto an adhesive face T1a of a chip-securing tape T1. Each chip C bears a plane electrode (not shown) as an external electrode already formed on a side to which the sinter-bonding sheet 10 is applied (the upper side in FIGS. 2(a)-2(d)). Each chip C bears, as needed, other components such as electrode pads (not shown) on the other side (opposed side) (the under side in FIGS. 2(a)-2(d)). The sinter-bonding sheet 10 is a sheet having a composition including a binder component, and sinterable particles containing a conductive metal, and bears a release liner L on one side thereof.

Next, the sinter-bonding sheet 10 lies on the chips C, as illustrated in FIG. 2(b). Specifically, the sinter-bonding sheet 10 is applied to the chips C while being pressed from the release liner L side toward the chips C. A non-limiting example of the pressing means or device is a pressure roller. The lamination is performed at a temperature of typically from room temperature to 200° C. under a load of typically from 0.01 to 10 MPa.

Figure 2C:
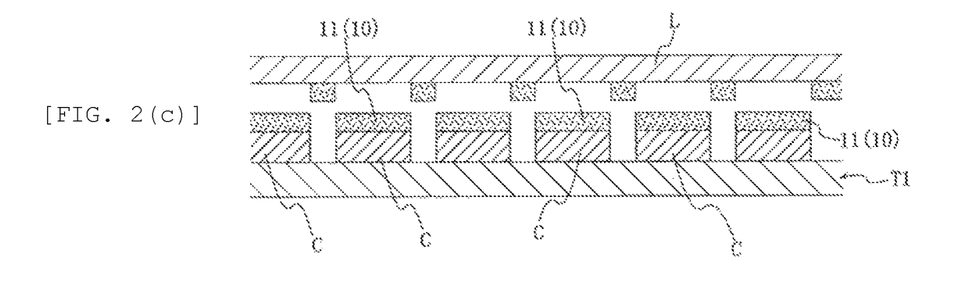

Next, the release liner L is removed, as illustrated in FIG. 2(c). This transfers portions of the sinter-bonding sheet 10 to the surface of each chip C and gives chips C each with a sinter-bonding material layer 11.

Figure 2D:
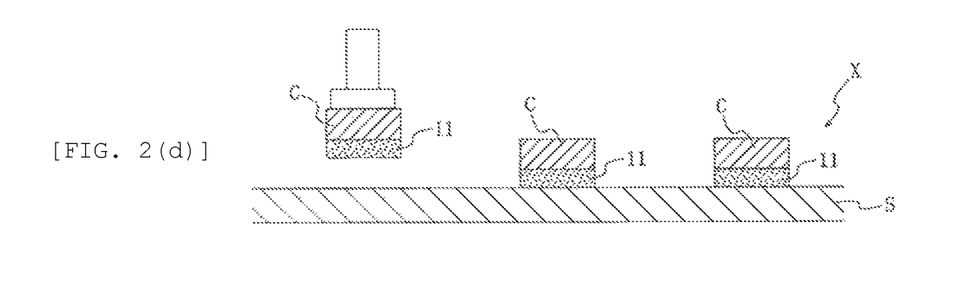

Next, the chips C are temporarily secured to the substrate S, as illustrated in FIG. 2(d). Specifically, the chips C each with the sinter-bonding material layer are pressed and thus temporarily secured through the sinter-bonding material layer 11 onto the substrate S. The sinter-bonding work X can be prepared by the above procedure.

The sinter-bonding sheet 10 used in the preparation of the sinter-bonding work X serves as a source to feed a sinter-bonding material and is a sheet having a composition including a binder component and sinterable particles containing a conductive metal.

The sinterable particles in the sinter-bonding sheet 10 are particles that contain a conductive metal element and are sinterable. Non-limiting examples of the conductive metal element include gold, silver, copper, palladium, tin, and nickel. Non-limiting examples of a material to constitute such sinterable particles include gold, silver, copper, palladium, tin, and nickel; and alloys of two or more different metals selected from the group of these metals. Non-limiting examples of a material to constitute the sinterable particles also include metal oxides such as silver oxide, copper oxide, palladium oxide, and tin oxide. The sinterable particles may also be particles having a core-shell structure. For example, the sinterable particles may be core-shell structure particles, which include a core mainly containing copper, and a shell mainly containing, for example, gold or silver and covering the core. In the embodiment, the sinterable particles preferably include at least one selected from the group consisting of silver particles, copper particles, silver oxide particles, and copper oxide particles. The sinterable particles are preferably selected from silver particles and copper particles, from the viewpoint of actually providing high electric conductivity and high thermal conductivity in the formed sintered layers. In addition, silver particles are easily handleable and preferred from the viewpoint of oxidation resistance. For example, assume that a sintering process operates in sinter bonding of semiconductor chips to a silver-plated copper substrate, using a sintering material including copper particles as the sinterable particles. This sintering process has to be performed in an inert environment such as a nitrogen atmosphere. However, a sintering process in sinter bonding using a sintering material including silver particles as the sinterable particles can operate appropriately even in an air atmosphere.

The sinterable particles for use herein have an average particle size (average particle diameter) of preferably 2000 nm or less, more preferably 800 nm or less, and still more preferably 500 nm or less, from the viewpoint typically of actually providing a low sintering temperature of the sinterable particles to surely provide satisfactory sinterability. The sinterable particles have an average particle size of preferably 1 nm or more, preferably 10 nm or more, more preferably 50 nm or more, and still more preferably 100 nm or more, from the viewpoint of allowing the sinterable particles to be satisfactorily dispersible in the sinter-bonding sheet 10 or in the composition to form the sinter-bonding sheet 10. The average particle size of the sinterable particles can be measured by observation using a scanning electron microscope (SEM).

The sinter-bonding sheet 10 contains the sinterable particles in a proportion of preferably 60 to 99 mass percent, more preferably 65 to 98 mass percent, and still more preferably 70 to 97 mass percent, from the viewpoint of actually providing highly reliable sinter bonding.

In the embodiment, the binder component in the sinter-bonding sheet 10 includes a thermally decomposable polymer binder and a low-boiling binder and may further include one or more other components such as a plasticizer. The thermally decomposable polymer binder is a binder component that is decomposable in a high-temperature heating process for sinter bonding, and is an element that contributes to a retained sheet form of the sinter-bonding sheet 10 before the heating process. In the embodiment, the thermally decomposable polymer binder is a material that is solid at room temperature (23° C.), from the viewpoint of surely providing sheet form retainability. Non-limiting examples of such thermally decomposable polymer binders include polycarbonate resins and acrylic resins.

Examples of the polycarbonate resins for use as the thermally decomposable polymer binder include aliphatic polycarbonates whose backbone is composed of an aliphatic chain and does not include benzene rings and other moieties derived from aromatic compounds, between carbonic acid ester groups (—O—CO—O—) in the backbone; and aromatic polycarbonates which include a moiety derived from an aromatic compound between carbonic acid ester groups (—O—CO—O—) in the backbone. Non-limiting examples of the aliphatic polycarbonates include poly(ethylene carbonate)s and poly(propylene carbonate)s. Non-limiting examples of the aromatic polycarbonates include polycarbonates including a bisphenol-A structure in the backbone.

Examples of the acrylic resins for use as the thermally decomposable polymer binder include polymers of an acrylic ester and/or a methacrylic ester each having $C_4$-$C_{10}$ linear or branched alkyl. Hereinafter the term "(meth) acrylic" indicates "acrylic" and/or "methacrylic"; and the term "(meth)acrylate" indicates "acrylate" and/or "methacrylate". Non-limiting examples of the alkyl moiety of the (meth)acrylic ester to form the acrylic resin as the thermally decomposable polymer binder include methyl, ethyl, propyl, isopropyl, n-butyl, t-butyl, isobutyl, amyl, isoamyl, hexyl, heptyl, cyclohexyl, 2-ethylhexyl, octyl, isooctyl, nonyl, isononyl, decyl, isodecyl, undecyl, lauryl, tridecyl, tetradecyl, stearyl, and octadecyl.

The acrylic resin as the thermally decomposable polymer binder may also be a polymer further including a monomer unit derived from a monomer other than the (meth)acrylic esters. Examples of such other monomers include carboxy-containing monomers, acid anhydride monomers, hydroxy-containing monomers, sulfo-containing monomers, and phosphate-containing monomers. Specifically, non-limiting examples of the carboxy-containing monomers include acrylic acid, methacrylic acid, carboxyethyl acrylate, carboxypentyl acrylate, itaconic acid, maleic acid, fumaric acid, and crotonic acid. Examples of the acid anhydride monomers include, but are not limited to, maleic anhydride and itaconic anhydride. Non-limiting examples of the hydroxy-containing monomers include 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and 4-(hydroxymethyl) cyclohexylmethyl (meth)acrylate. Non-limiting examples of the sulfo-containing monomers include styrenesulfonic acid, allylsulfonic acid, 2-(meth)acrylamido-2-methylpropanesulfonic acid, (meth)acrylamidopropanesulfonic acid, sulfopropyl (meth)acrylate, and (meth)acryloyloxynaphthalenesulfonic acid. Non-limiting examples of the phosphate-containing monomers include 2-hydroxyethylacryloyl phosphate.

The thermally decomposable polymer binder has a weight-average molecular weight of preferably 10000 or more. The "weight-average molecular weight" of the thermally decomposable polymer binder herein refers to a value measured by gel permeation chromatography (GPC) and calibrated with a polystyrene standard.

The sinter-bonding sheet 10 may contain the thermally decomposable polymer binder in a proportion of preferably 0.5 to 10 mass percent, more preferably 0.8 to 8 mass percent, and still more preferably 1 to 6 mass percent, from the viewpoint of appropriately exhibiting the function of sheet form retaining.

The "low-boiling binder" in the sinter-bonding sheet 10 refers to a binder that has a viscosity of $1 \times 10^5$ Pa·s or less and is liquid or semi-liquid at 23° C., where the viscosity is measured using a dynamic viscoelastometer (trade name HAAKE MARS III, supplied by Thermo Fisher Scientific). The viscosity measurement operates using 20-mm diameter parallel plates as fixtures at a plate-to-plate gap of 100 μm and a shear rate in rotary shearing of 1 $s^{-1}$.

Non-limiting examples of the low-boiling binder contained in the sinter-bonding material layer 11 include terpene alcohols, alcohols other than terpene alcohols, alkylene glycol alkyl ethers, and ethers other than alkylene glycol alkyl ethers. Non-limiting examples of the terpene alcohols include isobornylcyclohexanol, citronellol, geraniol, nerol, carveol, and α-terpineol. Non-limiting examples of the alcohols other than terpene alcohols include pentanol, hexanol, heptanol, octanol, 1-decanol, ethylene glycol, diethylene glycol, propylene glycol, butylene glycol, and 2,4-diethyl-1,5pentanediol. Examples of the alkylene glycol alkyl ethers include ethylene glycol butyl ether, diethylene glycol methyl ether, diethylene glycol ethyl ether, diethylene glycol butyl ether, diethylene glycol isobutyl ether, diethylene glycol hexyl ether, diethylene glycol dimethyl ether, diethylene glycol diethyl ether, diethylene glycol dibutyl ether, diethylene glycol butyl methyl ether, diethylene glycol isopropyl methyl ether, triethylene glycol methyl ether, triethylene glycol dimethyl ether, triethylene glycol butyl methyl ether, propylene glycol propyl ether, dipropylene glycol methyl ether, dipropylene glycol ethyl ether, dipropylene glycol propyl ether, dipropylene glycol butyl ether, dipropylene glycol dimethyl ether, tripropylene glycol methyl ether, and tripropylene glycol dimethyl ether. Non-limiting examples of the ethers other than alkylene glycol alkyl ethers include ethylene glycol ethyl ether acetate, ethylene glycol butyl ether acetate, diethylene glycol ethyl ether acetate, diethylene glycol butyl ether acetate, and dipropylene glycol methyl ether acetate. The sinter-bonding sheet 10 may include each of different low-boiling binders alone or in combination. The low-boiling binder(s) in the sinter-bonding sheet 10 is preferably selected from terpene alcohols and is more preferably isobornylcyclohexanol, from the viewpoint of providing stability at room temperature.

The sinter-bonding sheet 10 has a thickness at 23° C. of preferably 5 μm or more, more preferably 10 μm or more, and preferably 300 μm or less, more preferably 200 μm or less, and still more preferably 150 μm or less. The sinter-bonding sheet 10 or the sinter-bonding composition to form the sheet 10 has a viscosity at 70° C. of typically $5 \times 10^3$ to $1 \times 10^7$ Pa·s, and preferably $1 \times 10^4$ to $1 \times 10^6$ Pa·s.

The sinter-bonding sheet 10 can be prepared typically by blending the components in a solvent (vehicle) to give a varnish, applying the varnish onto a separator serving as a carrier or substrate to form a coating, and drying the coating. Non-limiting examples of the solvent usable for the preparation of the varnish include organic solvents or alcohol solvents.

The semiconductor device manufacturing method according to the present invention performs, after the preparation step, the sinter bonding step in which each chip C is sinter-bonded to the substrate S in the sinter-bonding work X. Specifically, the sinter bonding step operates as follows.

Figure 3A:
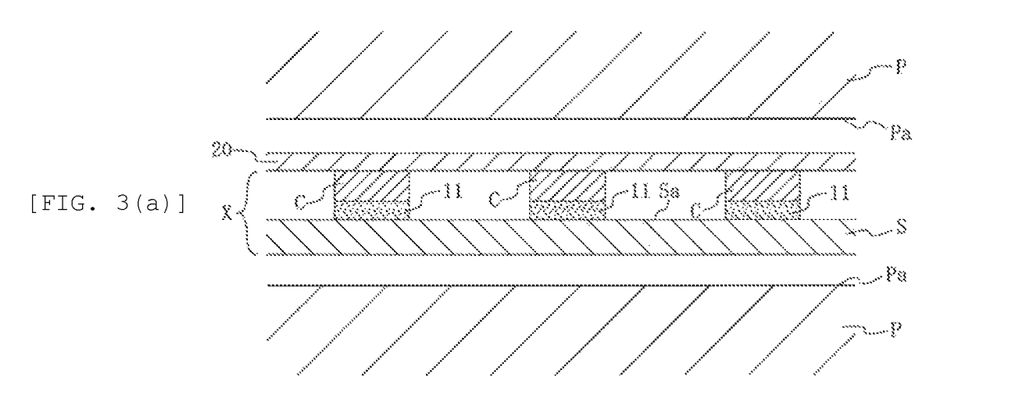
FIGS. 3(a)-3(c) depicts steps subsequent to the step illustrated in FIG. 1.
Figure 3B:
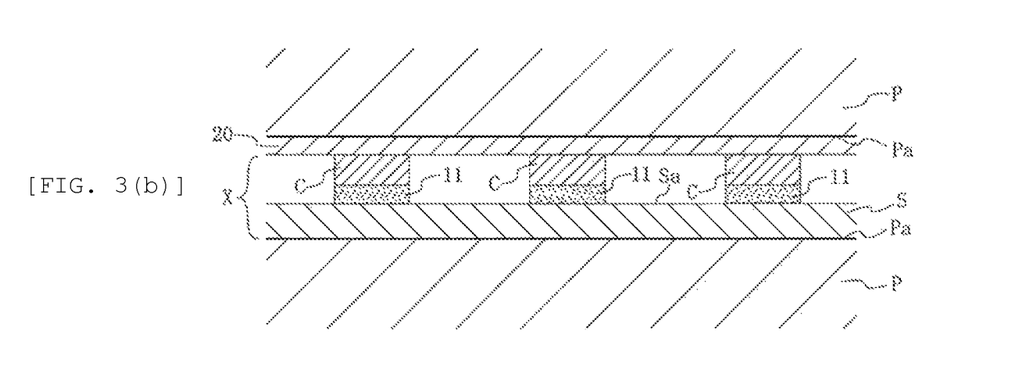

Initially, as illustrated in FIG. 3(a) and FIG. 3(b), the sinter-bonding work X and a cushioning sheet 20 lie over each other to give a stack, and the stack is held between a pair of pressing faces Pa, Pa of a pair of hot-press parallel plates P, P in a hot press machine. In FIG. 3(b), the cushioning sheet 20 lies over the chip-mounting side of the sinter-bonding work X. Non-limiting examples of a material to constitute the cushioning sheet 20 include fluorocarbon resins such as tetrafluoroethylene resins (PTFEs); silicone resins such as polymethylsiloxanes; and carbon sheets.

The cushioning sheet 20 for use herein has a thickness of 5 to 5000 μm. The cushioning sheet 20 has a thickness of preferably 10 μm or more, more preferably 20 μm or more, and still more preferably 30 μm or more, from the viewpoint of surely having not only rigidity, but also shape retainability. The cushioning sheet 20 has a thickness of preferably 3000 μm or less, more preferably 1500 μm or less, still more preferably 1000 μm or less, and still more preferably 500 μm or less, from the viewpoint of cutting cost for the cushioning sheet 20 and, in addition, production cost for the semiconductor device. The cushioning sheet 20 may have dimensions in plan view equal to, or larger than, the dimensions in plan view of the sinter-bonding work X.

The cushioning sheet 20 has a tensile elastic modulus of 2 to 150 MPa. As used herein, the term "tensile elastic modulus" of the cushioning sheet refers to a value determined on the basis of measurement of a cushioning sheet test piece having a width of 10 mm, a length of 40 mm, and a thickness of 100 μm in a tensile test at an initial gripping distance of 10 mm, a temperature of 23° C., and a tensile speed of 50 mm/min. Specifically, the tensile elastic modulus can be determined from the slope of a rising straight line portion in early stages of the measurement, in a stress-strain curve plotted through the measurement. The tensile test as above can be performed typically using a tensile tester (trade name Autograph AGS-50NX, supplied by Shimadzu Corporation). The cushioning sheet 20 has a tensile elastic modulus of preferably 5 MPa or more, more preferably 15 MPa or more, and still more preferably 30 MPa or more, from the viewpoint of surely having not only rigidity, but also shape retainability. The cushioning sheet 20 has a tensile elastic modulus of preferably 150 MPa or less, more preferably 120 MPa or less, and still more preferably 100 MPa or less, from the viewpoint of actually having high cushioning properties.

The cushioning sheet 20 has a weight loss percentage at 350° C. of 0.1% or less, as determined in a weight loss measurement performed in an air atmosphere, starting at 25° C. which is the reference temperature for weight, and a rate of temperature rise of 10° C./min. In addition, the cushioning sheet has a weight loss percentage of 0% at the reference temperature for weight (25° C.). The weight loss percentage of a cushioning sheet can be measured on a cushioning sheet sample of about 10 mg using a simultaneous thermogravimetric/differential thermal analyzer. A non-limiting example of the analyzer is a differential thermogravimetric analyzer TG-DTA TG8120 supplied by Rigaku Corporation.

Figure 3C:
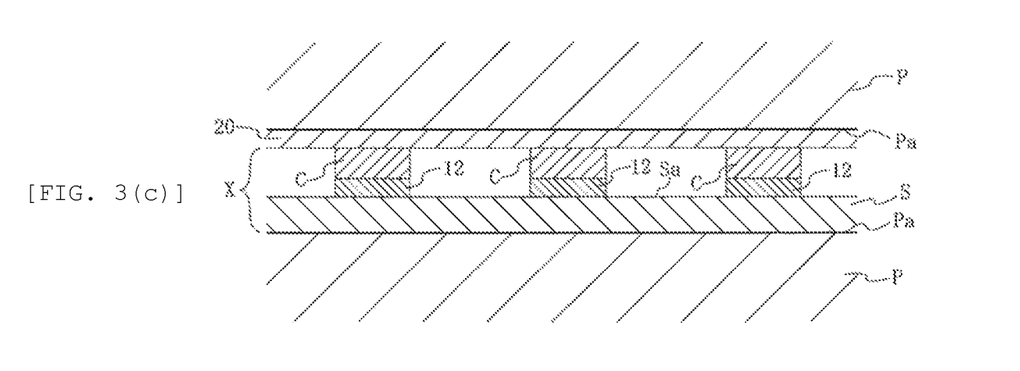

The sinter bonding step then performs a predetermined high-temperature heating process to allow each sinter-bonding material layer 11 in the sinter-bonding work X to convert into a sintered layer 12, as illustrated in FIG. 3(c). Specifically, the cushioning sheet 20 and the sinter-bonding work X lie over each other and are held between the pair of pressing faces Pa, Pa and, in this state, the sinter-bonding work X disposed between the pressing faces Pa, Pa undergoes a predetermined high-temperature heating process while being pressurized in the thickness direction or the lamination direction of the work X. This causes the low-boiling binder in the sinter-bonding material layer 11 to volatilize (evaporate), causes the thermally decomposable polymer binder to thermally decompose and volatilize, and causes the conductive metal in the sinterable particles to sinter, where these occur between the substrate S and the chip C. With this step, a sintered layer 12 is formed between the substrate S and each chip C, and this allows the chip C to sinter-bond to the substrate S or its surface Sa while establishing electrical connection with the substrate S.

In the step, the heating for sinter bonding operates at a temperature of typically 150° C. to 400° C., preferably 200° C. to 400° C., and more preferably 250° C. to 350° C. The pressurization for sinter bonding operates at a pressure of preferably 5 MPa or more, and typically 60 MPa or less, and preferably 40 MPa or less. The temperature condition and the pressure condition as above are advantageous for forming a strong or firm sintered layer 12 between the substrate S and each chip C as a result of sinter bonding. The pressurization and heating for sinter bonding operates for a time of typically 0.3 to 300 minutes, and preferably 0.5 to 240 minutes. The step preferably operates in a nitrogen atmosphere under reduced pressure, or in a reducing gas atmosphere, from the viewpoint of eliminating or minimizing oxidation of the metal that is involved in sinter bonding.

Such sintered layers 12 formed in the step have an average thickness of preferably 5 to 200 μm, and more preferably 10 to 150 μm. This configuration is preferred for relaxing the internal stress in the sintered layers 12 caused by heat stress, to surely have sufficient thermal-shock reliability and for reducing not only the sinter bonding cost, but also the semiconductor device production cost.

Figure 4A:
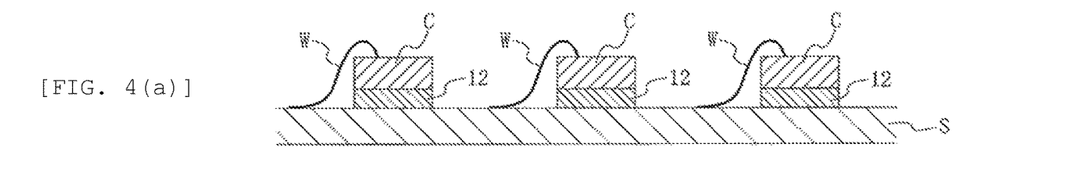
FIGS. 4(a) and 4(b) depicts steps subsequent to the steps illustrated in FIGS. 3(a)-3(c)

The semiconductor device manufacturing method according to the embodiment then performs a wire bonding step, in which a terminal area (not shown) of each chip C and a terminal area (not shown) of the substrate S are electrically connected (coupled) to each other, where necessary via a bonding wire W, as illustrated in FIG. 4(a). The connection between the bonding wire W and the terminal area of the chip C or the terminal area of the substrate S is provided typically through ultrasonic welding with heating. Non-limiting examples of the bonding wire W usable herein include gold wires, aluminum wires, and copper wires. The wire bonding operates at a wire heating temperature of typically 80° C. to 250° C., and preferably 80° C. to 220° C., for a heating time from several seconds to several minutes.

Figure 4B:
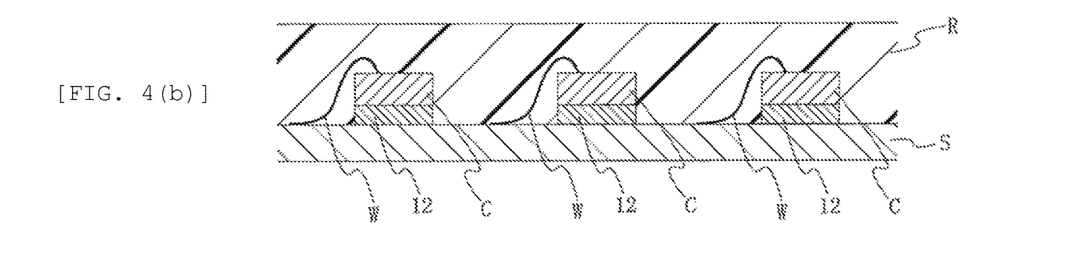

Next, a resinous encapsulant R is formed to protect the chips C and the bonding wires W on the substrate S (encapsulation step), as illustrated in FIG. 4(b). In this step, the resinous encapsulant R is disposed or formed by the transfer molding technology using dies. The resinous encapsulant R may be made typically from an epoxy resin. The heating to form the resinous encapsulant R in the step operates at a temperature of typically 165° C. to 185° C. for a time typically from 60 seconds to several minutes. The resinous encapsulant R, when not sufficiently cured in the encapsulation step, subsequently undergoes a postcure step to be fully cured.

Thus, a semiconductor device including semiconductor chips in sinter-bonded areas can be manufactured.

In the sinter bonding step described above with reference to FIGS. 3(a)-3(c) in the semiconductor device manufacturing method according to the embodiment, the sinter-bonding work X lies over the cushioning sheet 20 having a thickness of 5 to 5000 μm and a tensile elastic modulus of 2 to 150 MPa to give a stack, and the stack is held between the pressing faces Pa, Pa of the pair of parallel plates P, P in the hot press machine, and, in this state, is heated with pressurization. This configuration is suitable for actually providing high uniformity in pressure or load between the sinter-bonding material layers 11, where the pressure or load acts upon the sinter-bonding work X held between the parallel plates P, P in the sinter bonding step. This is because the cushioning sheet 20, which has a thickness of 5 to 5000 μm and a tensile elastic modulus of 2 to 150 MPa and lies over the sinter-bonding work X, can exhibit its cushioning function in the sinter bonding step. Specifically, the cushioning function is the function of effectively absorbing and reducing or eliminating the deviation or inclination from the ideal parallel position in the pair of pressing faces Pa, Pa; and the difference, if any, between or among the chips C in height (dimension) from the surface Sa of the substrate S to the top face of the chip C.

In addition, the cushioning sheet 20 having a thickness of 5 to 5000 μm and a tensile elastic modulus of 2 to 150 MPa has sufficient shape retainability and is easy to handle in the semiconductor device manufacture process. The cushioning sheet 20 as above can readily lie over the sinter-bonding work X efficiently in a suitable arrangement in the sinter bonding step. The cushioning sheet 20 as above resists excessive compressive deformation and sagging deformation in the sinter bonding step through a high-temperature pressurization process. Assume that a cushioning material sheet used in the high-temperature pressurization process undergoes excessive compressive deformation or sagging deformation so as to embed the chip(s) C over the substrate S, and closed space (space closed as surrounded by the substrate S, the chip C, and the cushioning sheet) forms around the chip C. In this case, a component volatilized and escaped from the sinter-bonding material layer 11 may be deposited on the substrate S. Undesirably, the deposition as above, if formed, requires an additional cleaning step for cleaning the deposited portion. The cushioning sheet 20 is suitable for avoiding such a problem, because the cushioning sheet 20 resists excessive compressive deformation and sagging deformation in the sinter bonding step through a high-temperature pressurization process.

As described above, the semiconductor device manufacturing method according to the embodiment is suitable for sinter bonding of chips C to the substrate S by batch (by one operation).

The cushioning sheet 20 has a weight loss percentage from 25° C. to 350° C. of preferably 0.1% or less, as described above. This configuration is advantageous for allowing the cushioning sheet 20 to sufficiently exert its functions, such as the cushioning function, in the sinter bonding step through a high-temperature heating process.

Figure 5:
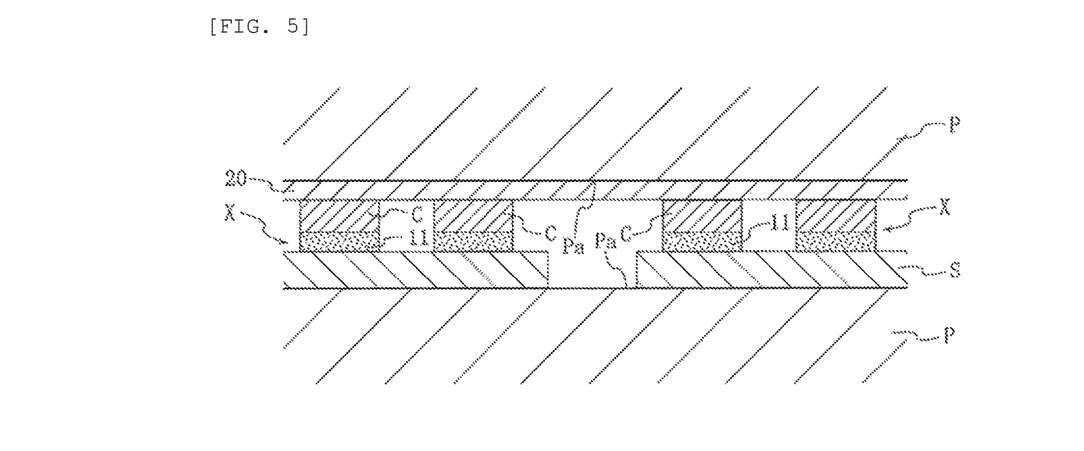
FIG. 5 depicts a variation of the usage mode of a cushioning sheet in the sinter bonding step.
Figure 6:
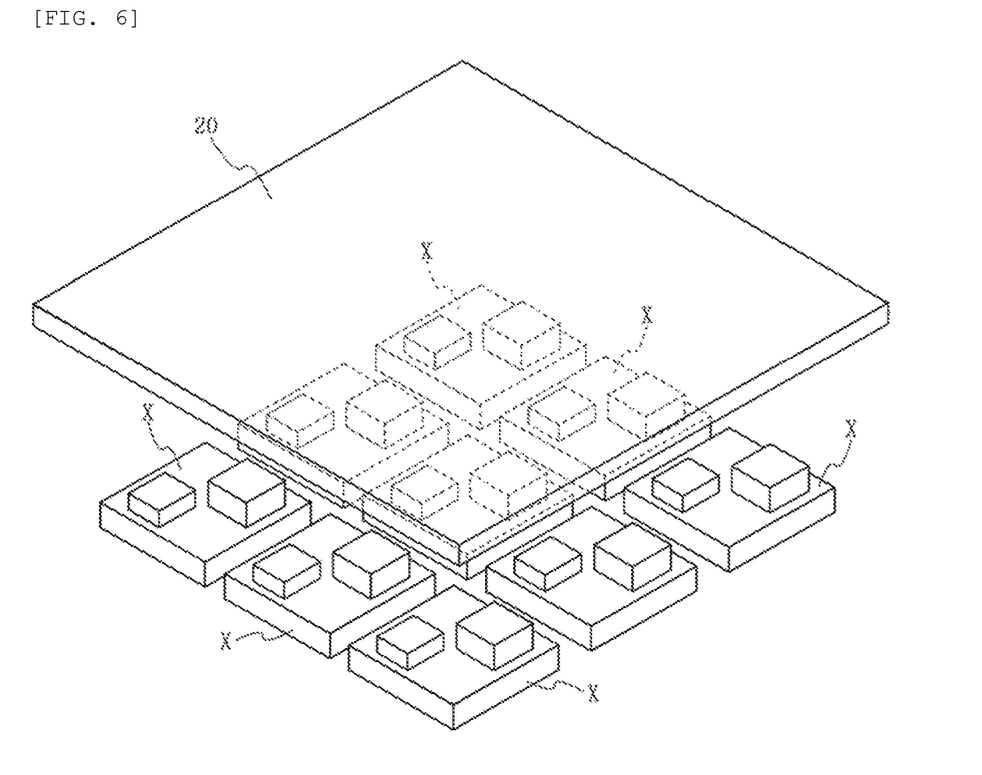
FIG. 6 depicts another variation of the usage mode of a cushioning sheet in the sinter bonding step.

The sinter bonding step in the semiconductor device manufacturing method according to the embodiment may perform sinter bonding on multiple sinter-bonding works X batchwise. Specifically, sinter bonding may be performed so that the cushioning sheet 20 lies over the sinter-bonding works X each with multiple chips C, and the resulting article is held between a pair of pressing faces Pa, Pa, and, in this state, the sinter-bonding works X disposed between the pressing faces Pa, Pa receive a predetermined high-temperature heating process while being pressurized in the thickness direction or lamination direction of the works X as illustrated in FIG. 5. The sinter-bonding works X to lie over the cushioning sheet 20 in the sinter bonding step may be arrayed in rows and columns, typically as illustrated in FIG. 6 for an array in 3 rows and 3 columns. In the sinter bonding step as above, the cushioning sheet 20, which has a thickness of 5 to 5000 μm and a tensile elastic modulus of 2 to 150 MPa and is to lie over the sinter-bonding works X, can exert the cushioning function of effectively absorbing and eliminating or minimizing the difference, if any, between the sinter-bonding works X in thickness of the sinter-bonding works X including the thickness of the substrate S. The cushioning function as above, when exerted, uniformizes the pressure or load between sinter-bonding material layers 11, where the pressure or load acts upon the sinter-bonding works X held between the parallel plates P, P in the sinter bonding step.

Figure 7A:
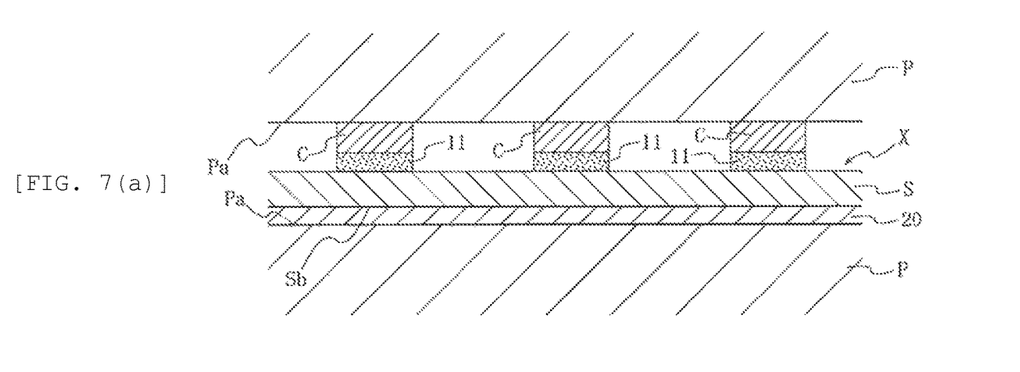
FIGS. 7(a)-7(b) depicts other variations of the usage mode of the cushioning sheet in the sinter bonding step.
Figure 7B:
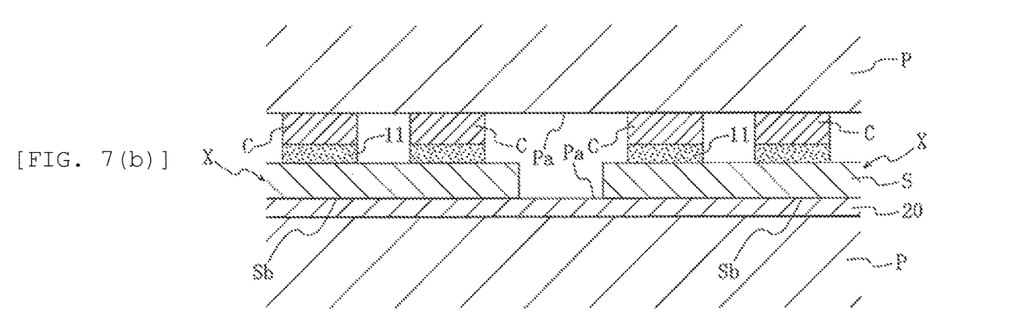

In the sinter bonding step in the semiconductor device manufacturing method according to the embodiment, the cushioning sheet 20 may lie over the face Sb of the substrate S, where the face Sb is opposite to the sinter-bonding work(s) X, as illustrated in FIG. 7(a) and FIG. 7(b). This configuration also contributes to uniformization of the pressure or load between the sinter-bonding material layers 11 by the working of the cushioning function of the cushioning sheet 20, where the pressure or load acts upon the sinter-bonding work(s) X held between the parallel plates P, P.

Figure 8:
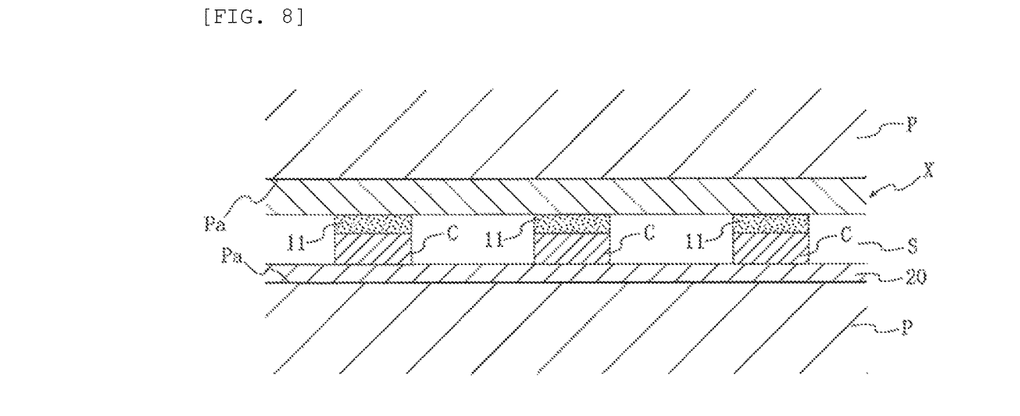
FIG. 8 depicts another variation of the usage mode of the cushioning sheet in the sinter bonding step.

In the sinter bonding step in the semiconductor device manufacturing method according to the embodiment, the cushioning sheet 20 may lie over a sinter-bonding work X that bears chips facing downward, where the cushioning sheet 20 faces the side of the work X on which the chips are disposed, as illustrated in FIG. 8. This configuration also contributes to uniformization of the pressure or load between the sinter-bonding material layers 11 by the working of the cushioning function of the cushioning sheet 20, where the pressure or load acts upon the sinter-bonding work X held between the parallel plates P, P. In addition, the configuration is advantageous for avoiding the formation of the closed space which invites the deposition of a component derived from the sinter-bonding material layers 11 onto the substrate S.

The cushioning sheet 20 for use in the semiconductor device manufacturing method according to the embodiment may have through holes that penetrate the cushioning sheet 20 in the thickness direction. This configuration is advantageous for avoiding the formation of the closed space which invites the deposition of a component derived from the sinter-bonding material layers 11 onto the substrate S.

EXAMPLES

Preparation of Sinter-Bonding Sheet

Materials were mixed using a hybrid mixer (trade name HM-500, supplied by KEYENCE CORPORATION) in its stirring mode and yielded a varnish. The stirring was performed for 3 minutes. The materials were 35.86 parts by mass of first silver particles (average particle size 60 nm, supplied by DOWA Electronics Materials Co., Ltd.) as sinterable particles; 23.90 parts by mass of second silver particles (average particle size 1100 nm, supplied by MITSUI MINING & SMELTING CO., LTD.) also as sinterable particles; 0.87 part by mass of a polycarbonate resin (trade name QPAC40, having a weight-average molecular weight of 150000, solid at room temperature, supplied by Empower Materials) as a thermally decomposable polymer binder; 3.47 parts by mass of isobornylcyclohexanol (trade name TERSOLVE MTPH, liquid at room temperature, supplied by Nippon Terpene Chemicals, Inc.) as a low-boiling binder; and 35.91 parts by mass of methyl ethyl ketone as a solvent. The prepared varnish was applied to a releasably treated film (trade name MRA50, supplied by Mitsubishi Plastics, Inc.), dried, and yielded a 40-μm thick sheet of a sinter-bonding composition. The drying was performed at a temperature of 110° C. for a time of 3 minutes. The procedure gave a sinter-bonding sheet including the sinterable particles, the thermally decomposable polymer binder, and the low-boiling binder.

Example 1

Preparation of silicon chips each with a sinter-bonding material layer, preparation of a sinter-bonding work by temporary securing of the chips to a copper substrate, and batch sinter bonding in the work were performed by the following procedure. The resulting sinter-bonded areas were observed.

Preparation of Silicon Chips with Sinter-Bonding Material Layer

Initially, a silicon chip (5-mm square, 350-µm thick) having a plane electrode (5-mm square) on one side was prepared. The plane electrode has a multilayer structure including a Ti layer (50-nm thick) on the silicon chip surface, and a Au layer (100-nm thick) on the Ti layer. Next, on the plane electrode of the silicon chip, the sinter-bonding sheet was laminated using a laminator having a pressure roller. The lamination was performed at a temperature of 70° C., a lamination load (pressure by the pressure roller) of 0.3 MPa, and a speed of the pressure roller of 10 mm/sec. After the lamination, other portions than the compression-bonded portion of the sinter-bonding sheet bonded to the plane electrodes of the silicon chips were removed while remaining the compression-bonded portions on the electrodes. This yielded a silicon chip with a 5-mm square sinter-bonding material layer on one side. Thus, a required number of silicon chips each with a sinter-bonding material layer was prepared.

Preparation of Sinter-Bonding Works

Two silicon chips each with a sinter-bonding material layer were compression-bonded and thereby temporarily secured to a 3-mm thick copper plate entirely coated with a 5-µm thick Ag film, so that the sinter-bonding material layer faced the copper plate. This yielded a sinter-bonding work. Thus, two sinter-bonding works were prepared.

Batch Sinter Bonding

The sinter-bonding works prepared by the above procedure received batch sinter bonding using a sintering apparatus having pair of hot-press parallel plates (trade name HTM-3000, supplied by Hakuto Co., Ltd.). Specifically, a 30-µm thick first cushioning sheet (trade name 900UL, supplied by Nitto Denko Corporation) lay over the sinter-bonding works (each bearing temporarily-bonded two semiconductor chips with a sinter-bonding material layer), and the resulting stack was held between pair of pressing faces of the pair of parallel plates. While being in this state, the sinter-bonding works disposed between the pressing faces underwent a heating process while being pressurized in the lamination direction of each work. This allowed each sinter-bonding material layer in each sinter-bonding work to convert into a sintered layer. The sinter bonding step as above was performed at a pressure in the pressurization of 10 MPa. In the heating process, the works were raised in temperature from 80° C. up to 300° C. at a rate of temperature rise of 1.5° C./sec and held at 300° C. for 2.5 minutes. The works were then cooled down to 170° C. by air cooling, and further cooled down to 80° C. by water cooling. The water cooling was performed with a water cooling mechanism provided in the parallel plates.

Observation of Sinter-Bonded Areas

Each of sinter-bonded areas in the sinter-bonding works was observed using a scanning acoustic tomograph/inspection equipment (trade name FineSAT FS200, supplied by Hitachi Power Solutions Co., Ltd.). In each sinter-bonding work, there was observed no bonding failure in the sintered layers formed between the copper substrate and the two silicon chips, where the bonding failure refers to a state in which the periphery of the sintered layer fails to bond to the substrate or to the semiconductor chip. The results are presented in Table 1.

Example 2

The process from the preparation of silicon chips each with a sinter-bonding material layer to the batch sinter bonding, and the observation of sinter-bonded areas were performed by a procedure similar to that in Example 1, except that the sinter bonding step employed a 100-µm thick second cushioning sheet (trade name 900UL, supplied by Nitto Denko Corporation) instead of the 30-µm thick first cushioning sheet. In each sinter-bonding work, there was observed no bonding failure in the sintered layers formed between the copper substrate and the two silicon chips, where the bonding failure refers to a state in which the periphery of the sintered layer fails to bond to the substrate or to the semiconductor chip. The results are presented in Table 1.

Example 3

The process from the preparation of silicon chips each with a sinter-bonding material layer to the batch sinter bonding, and the observation of sinter-bonded areas were performed by a procedure similar to that in Example 1, except that the sinter bonding step employed a 30-µm thick third cushioning sheet (trade name 920UL, supplied by Nitto Denko Corporation) instead of the 30-µm thick first cushioning sheet. In each sinter-bonding work, there was observed no bonding failure in the sintered layers formed between the copper substrate and the two silicon chips, where the bonding failure refers to a state in which the periphery of the sintered layer fails to bond to the substrate or to the semiconductor chip. The results are presented in Table 1.

Comparative Example 1

The process from the preparation of silicon chips each with a sinter-bonding material layer to the batch sinter bonding, and the observation of sinter-bonded areas were performed by a procedure similar to that in Example 1, except that the sinter bonding step employed no cushioning sheet. In the sinter-bonding works, there was a sintered layer or layers suffering from bonding failure, where the bonding failure refers to a state in which the periphery of the sintered layer fails to bond to the substrate or to the semiconductor chip. The results are presented in Table 1.

Comparative Example 2

The process from the preparation of silicon chips each with a sinter-bonding material layer to the batch sinter bonding, and the observation of sinter-bonded areas were performed by a procedure similar to that in Example 1, except that the sinter bonding step employed a 30-µm thick fourth cushioning sheet instead of the 30-µm thick first cushioning sheet. The fourth cushioning sheet was prepared by the following procedure.

Initially, a mixture was prepared by blending 2031 g of a predetermined polydimethylsiloxane having a terminal silanol group at both ends (number-average molecular weight 11500), 15.71 g of vinyltrimethoxysilane, and 2.80 g of (3-glycidoxypropyl)trimethoxysilane. Next, the mixture mixed with 0.97 mL of a methanol solution of tetramethylammonium hydroxide, which serves as a condensation catalyst (having a concentration of 10 mass percent and a catalyst content of 0.88 mmol), followed by stirring at 40° C. for one hour (condensation). Next, the resulting composition was stirred at 40° C. under reduced pressure (10 mmHg) for one hour. This removed volatile components, such as methanol, from the composition. Next, at normal atmospheric pressure, the composition combined with 44.5 g of an organohydrogensiloxane (supplied by Shin-Etsu Chemical Co., Ltd., dimethylpolysiloxane-co-methylhydrogenpolysiloxane, average molecular weight 2000), followed by stirring at 40° C. for one hour, further combined with 0.13 g of a siloxane solution of a platinum-carbonyl complex, which serves as an addition catalyst (platinum concentration 2 mass percent), followed by stirring at 40° C. for 10 minutes (addition reaction). This gave a thermosetting silicone resin composition. Next, the thermosetting silicone resin composition combined with 20 mass percent of polymethylsilsesquioxane fine particles (trade name Tospearl 2000B, having an average particle diameter of 6.0 μm, supplied by Momentive Performance Materials Japan LLC), and the resulting composition was stirred at room temperature (25° C.) for 10 minutes. The composition after stirring received degassing using a vacuum dryer at room temperature for 30 minutes or longer. The resulting resin composition for cushioning sheet formation prepared by the above procedure was applied onto a polyester film (trade name SS4C, having a thickness of 50 μm, supplied by Nippa Corporation) as a release sheet, followed by heating at 135° C. for 9 minutes. This formed a 30-μm thick semi-cured silicone resin sheet on the release sheet. The fourth cushioning sheet used in Comparative Example 2 is one prepared by the above procedure.

Comparative Example 3

The process from the preparation of silicon chips each with a sinter-bonding material layer to the batch sinter bonding, and the observation of sinter-bonded areas were performed by a procedure similar to that in Example 1, except that the sinter bonding step employed a 30-μm thick fifth cushioning sheet (trade name 9700UL, supplied by Nitto Denko Corporation) instead of the 30-μm thick first cushioning sheet. In the sinter-bonding works, there was a sintered layer or layers suffering from bonding failure, where the bonding failure refers to a state in which the periphery of the sintered layer fails to bond to the substrate or to the semiconductor chip. The results are presented in Table 1.

Tensile Elastic Modulus of Cushioning Sheet

The cushioning sheets used in Examples 1 to 3 and Comparative Examples 1 to 3 were evaluated for tensile elastic modulus. Specifically, a cushioning sheet test piece (having a width of 10 mm, a length of 40 mm, and a thickness of 100 μm) having the corresponding formulation received a tensile test at an initial gripping distance of 10 mm, a temperature of 23° C., and a tensile speed of 50 mm/min., using a tensile tester (trade name Autograph AGS-50NX, supplied by Shimadzu Corporation). The tensile elastic modulus (MPa) was determined from the slope of a rising straight line portion in early stages of the measurement, in a stress-strain curve obtained by the measurement in the test. The results are presented in Table 1.

Heat Resistance of Cushioning Sheet

The cushioning sheets used in Examples 1 to 3 and Comparative Examples 1 to 3 were evaluated for heat resistance. The results are presented in Table 1. Specifically, from a tested cushioning sheet, a sample of about 10 mg was cut out, and the sample received weight loss measurement in a temperature rise process using a simultaneous thermogravimetric/differential thermal analyzer (trade name Differential Thermogravimetric Analyzer TG-DTA TG8120, supplied by Rigaku Corporation). In the measurement, the temperature was raised from 25° C., which was the reference temperature for weight, to 500° C. in an air atmosphere at a rate of temperature rise of 10° C./min. The weight loss percentage (%) from the weight at 25° C. to the weight at 350° C. in the sample is presented in Table 1.

Workability in Batch Sinter Bonding

The fourth cushioning sheet used in Comparative Example 2 was too soft to lie over the sinter-bonding work during the course of the sinter bonding. In contrast, the other cushioning sheets did not suffer from the problem as above. The results are presented in Table 1.

Observation on Chip Damage

In Comparative Examples 1 and 3, some silicon chips in the sinter-bonding works which had undergone the batch sintering suffered from cracking or chipping. Examples 1 to 3 and Comparative Example 2 did not suffer from such cracking or chipping. The results are presented in Table 1.

TABLE 1

|  | Example 1 | Example 2 | Example 3 | Comparative Example 1 | Comparative Example 2 | Comparative Example 3 |
| --- | --- | --- | --- | --- | --- | --- |
| Thickness (μm) of cushioning sheet | 30 | 100 | 30 | — | 30 | 30 |
| Tensile elastic modulus (MPa) of cushioning sheet | 50 | 50 | 80 | — | 1.5 | 190 |
| Weight loss percentage (%) of cushioning sheet | 0 | 0 | 0 | — | 2 | 7 |
| Batch sinter bonding | Good | Good | Good | Poor | Good | Poor |
| Workability in sinter bonding step | Good | Good | Good | Good | Poor | Good |
| Chip damage after sinter bonding step | No | No | No | Yes | No | Yes |

As a summary of the above description, the configurations according to the present invention, as well as variations thereof, will be listed below as appendices.

APPENDIX 1

A method for manufacturing a semiconductor device, the method including the steps of
preparing a sinter-bonding work having a multilayer structure including
a substrate having a first surface, and a second surface opposite to the first surface;
a plurality of semiconductor chips facing, and to bond to, the first surface; and
a plurality of sinter-bonding material layers being disposed between the substrate and the individual semiconductor chips and containing sinterable particles; and
sinter bonding the sinter-bonding work, the step of sinter bonding including overlaying the sinter-bonding work and a cushioning sheet having a thickness of 5 to 5000 μm and a tensile elastic modulus of 2 to 150 MPa on each other to give a stack, holding the stack between a pair of pressing faces, and, in this state, subjecting the sinter-bonding work in the stack disposed between the pair of pressing faces to a heating process while pressurizing the sinter-bonding work in a lamination direction of the work, to form sintered layers from the sinter-bonding material layers.

APPENDIX 2

The method for manufacturing a semiconductor device according to Appendix 1, wherein the thickness of the cushioning sheet is 10 μm or more, preferably 20 μm or more, and more preferably 30 μm or more.

APPENDIX 3

The method for manufacturing a semiconductor device according to one of Appendices 1 and 2, wherein the thickness of the cushioning sheet is 3000 μm or less, preferably 1500 μm or less, more preferably 1000 μm or less, and still more preferably 500 μm or less.

APPENDIX 4

The method for manufacturing a semiconductor device according to any one of Appendices 1 to 3, wherein the tensile elastic modulus of the cushioning sheet is 5 MPa or more, preferably 15 MPa or more, and more preferably 30 MPa or more.

APPENDIX 5

The method for manufacturing a semiconductor device according to any one of Appendices 1 to 4, wherein the tensile elastic modulus of the cushioning sheet is 120 MPa or less, and preferably 100 MPa or less.

APPENDIX 6

The method for manufacturing a semiconductor device according to any one of Appendices 1 to 5, wherein the cushioning sheet has a weight loss percentage at 350° C. of 0.1% or less, as determined in a weight loss measurement performed in an air atmosphere, starting at 25° C. which is the reference temperature for weight, and a rate of temperature rise of 10° C./min.

APPENDIX 7

The method for manufacturing a semiconductor device according to any one of Appendices 1 to 6, wherein the sinter bonding step operates at a temperature in the heating process of 200° C. or higher and a pressure in the pressurization of 5 MPa or more.

APPENDIX 8

The method for manufacturing a semiconductor device according to any one of Appendices 1 to 7, wherein the sinterable particles include at least one selected from the group consisting of silver particles, copper particles, silver oxide particles, and copper oxide particles.

APPENDIX 9

The method for manufacturing a semiconductor device according to any one of Appendices 1 to 8, wherein the sinter-bonding material layers each contain the sinterable particles in a proportion of 60 to 99 mass percent, preferably 65 to 98 mass percent, and more preferably 70 to 97 mass percent.

APPENDIX 10

The method for manufacturing a semiconductor device according to any one of Appendices 1 to 9, wherein the sintered layers each have a thickness of 5 to 200 μm, and preferably 10 to 150 μm.

REFERENCE SIGNS LIST

X sinter-bonding work
S substrate
C chip (semiconductor chip)
10 sinter-bonding sheet
11 sinter-bonding material layer
12 sintered layer
20 cushioning sheet
Pa pressing face

The invention claimed is:
1. A method for manufacturing a semiconductor device, the method comprising the steps of
preparing a sinter-bonding work having a multilayer structure including
a substrate having a first surface, and a second surface opposite to the first surface;
a plurality of semiconductor chips facing, and to bond to, the first surface of the substrate; and
a plurality of sinter-bonding material layers each being disposed between the substrate and each semiconductor chip and containing sinterable particles; and
sinter-bonding the sinter-bonding work, the step of sinter bonding comprising:
overlaying the sinter-bonding work and a cushioning sheet having a thickness of 5 to 5000 μm and a tensile elastic modulus of 2 to 150 MPa on each other to give a stack;
holding the stack between a pair of pressing faces; and
subjecting the sinter-bonding work in the stack held between the pair of pressing faces to a heating process while pressurizing the work in a lamination direction of the work, to form sintered layers from the sinter-bonding material layers.

2. The method for manufacturing a semiconductor device according to claim 1,
   wherein the cushioning sheet has a weight loss percentage at 350° C. of 0.1% or less, as determined in a weight loss measurement performed in an air atmosphere, starting at 25° C. which is the reference temperature for weight, and a rate of temperature rise of 10° C./min.

3. The method for manufacturing a semiconductor device according to claim 1,
   wherein the sinter bonding step operates at a temperature in the heating process of 200° C. or higher and a pressure in the pressurization of 5 MPa or more.

4. The method for manufacturing a semiconductor device according to claim 1,
   wherein the sinterable particles include at least one selected from the group consisting of
   silver particles;
   copper particles;
   silver oxide particles; and
   copper oxide particles.

5. The method for manufacturing a semiconductor device according to claim 1,
   wherein the sinter-bonding material layers each contain the sinterable particles in a proportion of 60 to 99 mass percent.

6. The method for manufacturing a semiconductor device according to claim 1,
   wherein the sintered layers each have a thickness of 5 to 200 μm.

* * * * *